Nov. 19, 1968 A. L. WEISS 3,411,955

THERMOELECTRIC DEVICE

Filed Nov. 13, 1962

INVENTOR.
Adolph L. Weiss

BY
Sidney Carter
ATTORNEY 3,411,955

THERMOELECTRIC DEVICE

Adolph L. Weiss, Indianapolis, Ind., assignor to General Motors Corporation, Detroit, Mich., a corporation of Delaware Filed Nov. 13, 1962, Ser. No. 237,215
12 Claims. (Cl. 136—205)

This invention relates to a thermoelectric device and more particularly to an assembly including a plurality of semiconductor thermoelectric elements adapted for application in an array of a number of units for purposes of heating, cooling or electric generation.

In heating, cooling or electric generating devices utilizing the Peltier or Seebeck effects, pairs of dissimilar semiconductor thermoelectric elements are electrically interconnected in an arrangement such as to either pump heat to or extract heat from a particular environment upon passing a direct current through the elements or to generate electricity upon subjecting the opposite ends thereof to different temperatures.

In such systems, particularly thermoelectric power generators, the optimum operating temperatures are sufficiently high to cause oxidation and/or sublimation of the semiconductor material with resulting decrease in the efficiency of operation of the device. Present designs provide hermetically sealed enclosures filled with inert or reducing gases to protect the semiconductors from such deteriorating effects during operation. A second problem in such systems is the need for elastic loading of the semiconductor elements in order to permit take-up of thermal expansion of the semiconductor elements and other components of the system to ensure good electrical and thermal contact at junction points without breakage. Present designs provide for such expansion by spring loading the semiconductor element.

By the construction of my invention, both elastic loading and hermetic sealing of the semiconductor element are accomplished by a single member of the device, a bellows-like member, thereby providing a simple modular construction with greatly improved heat transfer and structural characteristics. Another feature of my invention is the elimination of the bellows-like member from the heat transfer process thus minimizing resistance to heat conductivity and enabling the use of the full cross-sectional area of the semiconductor element at its point of junction with the heat conducting member. This permits the attainment of lower cold end temperatures and thus higher efficiencies than is possible with present constructions.

Other features of my invention will be apparent from the following description of particular embodiments thereof taken in conjunction with the accompanying drawings in which.

Figure 1:
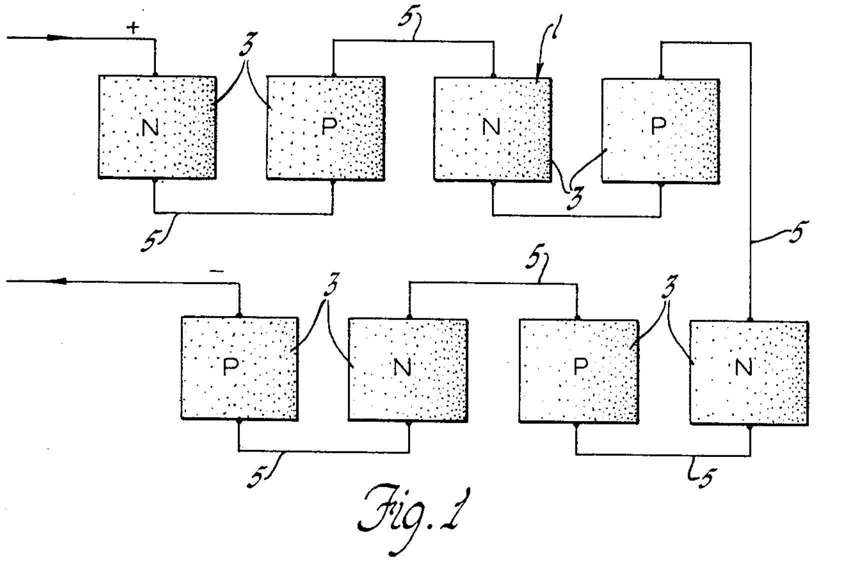
FIGURE 1 is a schematic type diagram showing the electrical circuit of a plurality of semiconductor thermoelectric elements as used in a thermoelectric device of my invention.

As shown in FIGURE 1, the device of my invention comprises an array 1 of a plurality of semiconductor thermoelectric elements 3 formed of two materials having dissimilar thermoelectric properties. The different materials are distinguished in the figures by the letters N and P, which designate the thermoelectric element as having either negative or positive thermoelectric properties. The elements 3 may be made from several materials available to and well-known in the art, antimony being typical of a P type material and bismuth being typical of an N type material. The several thermoelectric elements 3 of dissimilar electrical properties are electrically connected in series by means of interconnecting members 5 such as wire or strap type members formed of a material such as copper having good electrical and heat conducting properties. The interconnecting conductor members 5 form a junction with each pair of electrically adjacent dissimilar thermoelectric elements 3 which may be of any desired and suitable shape such as cylindrical or block form.

In accordance with the Peltier principle, the junctions formed on opposite ends of the thermoelectric elements 3 are capable of either absorbing heat or dissipating heat when a direct current is passed through the array. More specifically, the ends of the elements 3 at the junctions where the current passes from the P to the N type elements are capable of generating heat whereas the ends of the elements 3 where the current passes through the junction from the N element to a P element are capable of absorbing heat. Similarly, in accordance with the Seebeck principle a current will be caused to flow through the array 1 if the oppositely disposed junctions on the electrically adjacent P and N elements are maintained at different temperatures. Thus, regardless of whether the device embodying the features of my invention operates on the Peltier or the Seebeck principle, the opposite ends of interconnected elements 3 provide and constitute a plurality of cold junctions and a plurality of hot junctions. As shown in each of the figures, the elements 3 are positioned to dispose all the cold junctions in one direction and all the hot junctions in a generally opposite direction.

Figure 2:
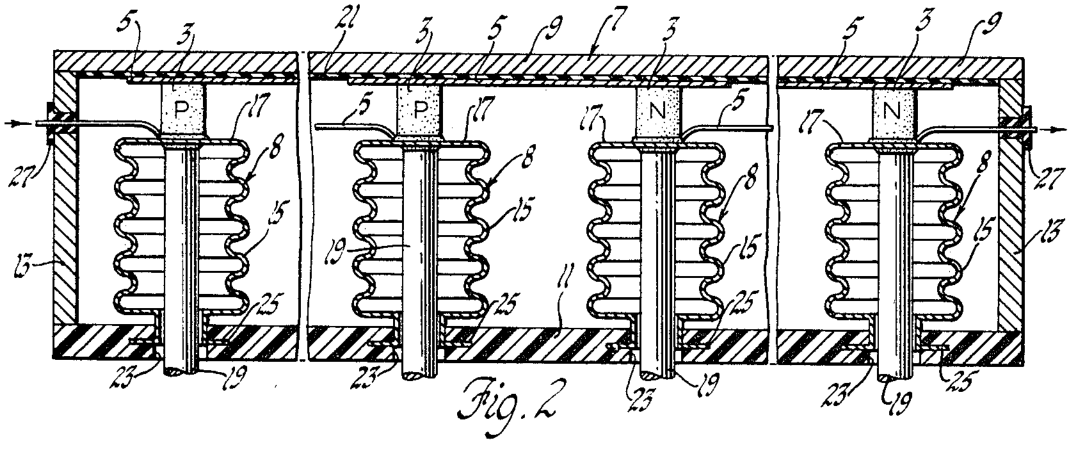
FIGURE 2 is an enlarged fragmentary partial sectional view of a thermoelectric device embodying the construction of my invention.

In accordance with my invention and as shown in FIGURE 2, the Peltier and Seebeck principles are applied by means of a simple gas-tight assembly of any desired shape. As shown, the assembly comprises a casing 7 having a plurality of thermoelectric modules 8 positioned therein. The casing 7 is formed of opposing end members 9 and 11 and side members 13, the resultant container being generally box-like in shape. The thermoelectric modules 8 comprise a bellows-like member 15 having one end 17 closed and the opposite end open and adapted to be secured in gas-tight electrically insulated relationship to the casing 7, a thermoelectric element 3 being positioned on the end 17 and on the outer surface of the member 15, and a good heat conducting member 19 being secured to the end 17 and on the inner surface of the member 15, the end 17 being in good heat conducting contact with the element 3 and the member 19.

More specifically, in the device shown in FIGURE 2, the member 9 is formed of a good heat conducting material, such as aluminum, iron, copper, brass, which is in good heat transfer relationship with one of the ends of each of the thermoelectric elements 3 positioned within the casing 7. The inner surface of the end 9 is preferably coated or otherwise provided with an electrical insulating material 21 to prevent shorting the electrical circuit formed through the elements 3. Such insulating material must not act as a barrier in the heat conduction path and thus may be a thin sheet or film of electrical insulating material such as mica or epoxy or other suitable resin. It is to be noted that it is only necessary to interpose the material 21 between the junctions and the end member 9. Side members 13 interconnect member 9 with a corresponding member 11 having a plurality of spaced apart openings 23 formed therein. As shown in FIGURE 2, member 11 is formed of an electrical insulating material such as epoxy resin or epoxy resin impregnated fiberglass cloth laminates in order to prevent shorting the electrical circuit formed through the elements 3.

As shown in FIGURE 2, the bellows-like member 15 is formed of any suitable metal such as brass having good heat conducting properties. The open end of member 15 is formed with a flange 25 to provide means for securing the member on and in gas-tight relationship with the end 11 and about the opening 23. As shown, the flanges are potted into the epoxy though it is of course possible to make the interconnection in any other desired and suitable manner such as cementing or mechanically securing, i.e., bolting, the bellows onto the end member. Also as shown, the good heat conducting member 19, a metal rod-like member formed of any suitable material such as aluminum, is welded, soldered or brazed to the inside of the end plate 17 which comprises the closed end of the bellows. The thermoelectric element 3 is positioned on the closed end of the bellows 15 and is shown as being soldered thereto. The ends of electrically adjacent dissimilar elements 3 remote from the bellows-contacting ends are electrically interconnected by means of conducting straps 5 to form a plurality of junctions in the manner described. As shown, the elements 3 are elastically loaded by the bellows members 15 to urge the ends of the elements and the straps 5 into good heat conducting relationship with the end member 9. The straps 5 are in good electrical contact with the elements 3 and are shown as being positioned thereon without being secured thereto as by welding or soldering which may be used if desired. To complete the electrical circuit of the array, the bellows-contacting ends of elements 3 are interconnected electrically by means of conducting wires to form the desired series circuit in which electrically adjacent elements have dissimilar thermoelectric properties.

While the preferred embodiment of my invention as shown in FIGURE 2 compises a metal bellows 15 to which the element 3 is welded or otherwise secured and at which point electrical connection is made to an element having different thermoelectric properties by a wire connector 5, these features of construction are not essential to my invention. More particularly, the element 3 may be merely positioned on without being secured to the bellows since it is elastically loaded thereby into contact with the end plate 9. Similarly, where the bellows is formed of metal, the electrical connection at the bellows end of the element 3 may be made by interconnecting the bellows themselves or the metal heat conducting members 19. Also, the bellows 15 need not be formed of metal but may instead be formed of any suitable material impervious to leakage of fluids such as a vinyl resin in which case the closed end would be formed of a metal plate to which the body of the bellows would be secured in order to not interpose a barrier in the heat path of the module 8 and to enable the conducting member 19 to be secured as bellows. Where the bellows material could not of itself elastically load the elements 3, this may be readily accomplished by providing the bellows with a resilient means such as a spring. In the construction of the device shown in FIGURE 2, the casing 7 is provided with a pair of seal conductors 27 through which connection may be made with wire conductors 5. The casing is filled with an inert or non-oxidizing gas such as nitrogen to preclude deterioration of the elements 3.

Figure 3:
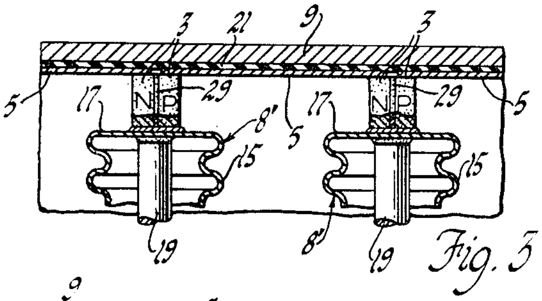
FIGURE 3 is an enlarged fragmentary partial sectional view of a thermoelectric device similar to that shown in FIGURE 2 and embodying a modification of the construction of my invention.

In the embodiment shown in FIGURE 3, the thermoelectric module 8′ comprises two thermoelectric elements 3, one a P-type and the other an N-type, positioned on each of the bellows 15. As shown, an insulating material 29 such as mica or epoxy resin may be positioned between the elements 3 which are electrically interconnected on the bellows 15 by its metal end 17. As in the case of the embodiment shown in FIGURE 2, the ends of dissimilar elements 3 remote from the bellows are interconnected by conducting straps 5 which are urged into good heat conducting contact with the end plate 9, insulating material 21 being interposed as described above. Though not shown, the bellows 15 and heat conducting rods 19 have the same relationship to end plate 11 as described above with regard to FIGURE 2.

Figure 4:
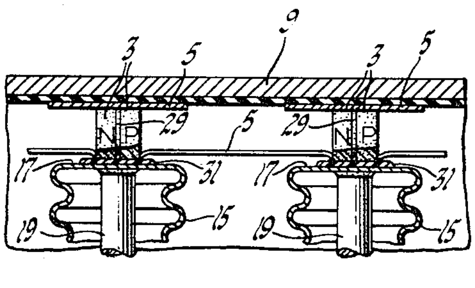
FIGURE 4 is a view similar to FIGURE 3 and shows still another embodiment of the construction of my invention.

In the embodiment shown in FIGURE 4, a pair of elements 3 are positioned on the bellows 15 as in FIGURE 3 except that an electrical insulating layer 31 is interposed between the bellows end plate 17 and the elements 3 and the electrical conducting strap 5 interconnects the two elements on and at the ends remote from the bellows. As shown, the wire conductors 5 connect the adjacent dissimilar elements 3 to form the series circuit as described. All other features of construction are the same as those described above for FIGURE 2.

From the foregoing description, it will be readily seen that I have provided a simple construction for elastically loading and hermetically sealing semiconductor thermoelectric elements within a thermoelectric assembly. While I have described my invention in terms of preferred embodiments, it should be understood that other variations will be apparent to those skilled in the art including carrying the shape of the casing and securing the bellows to a metal end plate where the bellows are not formed of metal. These and other embodiments are within the intended scope of my invention as defined by the claims which follow.

What is claimed is:

1. A thermoelectric device comprising a gas-tight casing having one end formed of a good heat conducting material and another end generally oppositely disposed thereto and having a plurality of openings formed therein in spaced relationship, an array of thermoelectric elements formed of dissimilar materials positioned within said casing and having a plurality of junctions of the hot type and a plurality of junctions of the cold type, said elements being positioned with all the junctions of one type in good heat conducting relationship with said end formed of good heat conducting material, a plurality of bellows-like members positioned within said casing and secured thereto in gas-tight electrically insulated relationship about said openings, a heat conducting member secured to the inner surface of the end of said bellows-like members remote from said apertures and extending therethrough, said elements being positioned on the outer surface of said end of said bellows-like members and in good heat conducting relationship with said heat conducting members, and the electrical connections to said array extending through said casing, said bellows-like members serving to complete the gas-tight seal of said casing and elastically urge said thermoelectric elements and said junctions of the one type into good heat conducting relationship with said first-mentioned end.

2. A device in accordance with claim 1 wherein said bellows-like members are metal bellows.

3. A device in accordance with claim 1 wherein each of said bellows-like members remote from said apertures has at least one of said elements positioned thereon.

4. A device in accordance with claim 1 wherein the good heat conducting material forming said casing end is a metal which is electrically insulated from said junctions in contact therewith, and wherein only one element is positioned on each bellows-like member.

5. A device in accordance with claim 1 wherein each of said bellows-like members has one open end and is secured to said casing with said open end about said apertures.

6. A device in accordance with claim 2 wherein the good heat conducting material forming said casing end is a metal which is electrically insulated from said junctions in contact therewith.

7. A device in accordance with claim 3 wherein said bellows-like members are metal bellows.

8. A device in accordance with claim 3 wherein a pair of elements is positioned on each bellows-like member.

9. A device in accordance with claim 7 wherein a pair of dissimilar elements is positioned on each bellows, said end of said bellows serving as the electrical connection between the elements mounted thereon.

10. A device in accordance with claim 8 wherein each of the elements of said pair is formed of dissimilar material and is electrically insulated from the other on said end of said bellows-like members and electrically interconnected at their ends remote from said bellows-like members.

11. A thermoelectric module comprising a metal bellows-like member, a pair of dissimilar thermoelectric elements positioned on and in good heat conducting relationship with one end of said member on the outer surface thereof, said one end serving as an electrical connection therebetween, and a good heat conducting member secured to said one end in good heat conducting relationship therewith and on the inner surface thereof, said bellows-like member being adapted to be secured within a casing to establish a thermoelectric array and to apply pressure to said thermoelectric element.

12. A thermoelectric module comprising a bellows-like member, to dissimilar thermoelectric elements positioned in good heat conducting relationship with and on the outer surface of one end of said member, said elements being electrically insulated from each other on the end of said member, the ends of said elements remote from said member being electrically interconnected, and a good heat conducting member secured to said one end in good heat conducting relationship therewith and on the inner surface thereof, said bellows-like member being adapted to be secured within a casing to establish a thermoelectric array and to apply pressure to said thermoelectric element.

References Cited

UNITED STATES PATENTS

| | | | |
|---|---|---|---|
| 2,997,514 | 8/1961 | Roeder | 136—204 |
| 3,129,116 | 4/1964 | Corry | 136—204 |
| 3,197,343 | 7/1965 | Palmatier | 136—212 |
| 3,208,877 | 9/1965 | Merry | 136—212 |

WINSTON A. DOUGLAS, *Primary Examiner.*

D. L. WALTON, *Assistant Examiner.*